United States Patent
Koo

(10) Patent No.: US 9,786,355 B2
(45) Date of Patent: *Oct. 10, 2017

(54) SIGNALING METHOD USING CONSTANT REFERENCE VOLTAGE AND DEVICES THEREOF

(71) Applicant: SAMSUNG ELECTRONICS CO., LTD., Suwon-si, Gyeonggi-Do (KR)

(72) Inventor: Kyung Hoi Koo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/377,756

(22) Filed: Dec. 13, 2016

(65) Prior Publication Data

US 2017/0092348 A1    Mar. 30, 2017

Related U.S. Application Data

(63) Continuation of application No. 14/497,726, filed on Sep. 26, 2014, now Pat. No. 9,537,676.

(30) Foreign Application Priority Data

Oct. 7, 2013    (KR) .................. 10-2013-0119349

(51) Int. Cl.
*H03K 5/04* (2006.01)
*G11C 11/4099* (2006.01)

(52) U.S. Cl.
CPC ................... *G11C 11/4099* (2013.01)

(58) Field of Classification Search
CPC .................. H04L 25/00; H03K 5/084
USPC ........................................... 327/175
See application file for complete search history.

(56) References Cited

U.S. PATENT DOCUMENTS

| | | | |
|---|---|---|---|
| 6,958,594 B2 | 10/2005 | Redl et al. | |
| 6,980,020 B2* | 12/2005 | Best | H04L 25/0278 326/30 |
| 7,049,859 B2 | 5/2006 | Boyer et al. | |
| 7,113,032 B2 | 9/2006 | Botti et al. | |
| 7,164,304 B2 | 1/2007 | Sekimoto | |
| 8,148,970 B2 | 4/2012 | Fuse et al. | |
| 2005/0057274 A1* | 3/2005 | Groen | H03K 19/01851 326/27 |
| 2007/0285121 A1* | 12/2007 | Park | H03K 19/01754 326/30 |
| 2012/0176156 A1* | 7/2012 | Chang | H04L 25/0278 326/62 |
| 2013/0101056 A1* | 4/2013 | Ahn | H03F 3/45183 375/257 |

(Continued)

FOREIGN PATENT DOCUMENTS

| | | |
|---|---|---|
| JP | 07312538 | 11/1995 |
| JP | 2001350530 | 12/2001 |

*Primary Examiner* — Ryan Jager
(74) *Attorney, Agent, or Firm* — Volentine & Whitt, PLLC

(57) ABSTRACT

A semiconductor device includes a receiver configured to receive a reference voltage via a first input terminal, receive an input signal via a second input terminal, and generate an output signal by comparing the reference voltage to the input signal with each other. A termination circuit associated with the input signal terminal may be adjusted and a logic threshold voltage may be adjusted to accommodate the adjustment in the termination circuit.

20 Claims, 12 Drawing Sheets

(56) References Cited

U.S. PATENT DOCUMENTS

2014/0043084 A1* 2/2014 Iwata ............... H03K 19/01852
  327/306

* cited by examiner

SIGNALING METHOD USING CONSTANT REFERENCE VOLTAGE AND DEVICES THEREOF

CROSS-REFERENCE TO RELATED APPLICATIONS

This application is a continuation application of U.S. application Ser. No. 14/497,726, filed on Sep. 26, 2014, which claims priority under 35 U.S.C. 119 to Korean Patent Application No. 10-2013-0119349, filed on Oct. 7, 2013, in the Korean Intellectual Property Office, the disclosure of which is incorporated herein in its entirety by reference.

BACKGROUND

Exemplary embodiments in accordance with principles of inventive concepts relate to electronic circuits, and more particularly, to a signaling circuit capable of compensating for duty ratio distortion, a signaling method, and a semiconductor device including the signaling circuit.

As data transmission/receiving speeds increase, signal integrity (which may also be referred to as 'signal fidelity') may be degraded. As the interface speed of memories increase (for example, at 800 MHz or higher), a termination method may be employed to improve signal fidelity.

Pseudo open drain (POD) termination of memory devices may be employed, for example, in mobile, or other, devices for which low-power operation is desirable. When POD termination is used, the signal swing is reduced to a half swing level (for example, a 0.5 VDDQ swing to a VDDQ swing) rather than a general full swing width (for example, 0 to a VDDQ swing), and the common voltage increases. Additionally, a mobile device, or other device employing the memory, may be operated at a low speed (for example, less than 800 MHz) without POD termination to reduce power consumption.

SUMMARY

Inventive concepts provide a signaling method in which a constant reference voltage may be used regardless of a termination operating mode, and devices thereof.

According to an aspect of the inventive concept, a semiconductor device includes a receiver configured to receive a reference voltage via a first input terminal, receive an input signal via a second input terminal, and generate an output signal by comparing the reference voltage and the input signal with each other; and a termination circuit connected to the second input terminal and configured to change a termination operating mode in response to a termination control signal. A logic threshold voltage of the receiver is changed according to the termination operating mode, in response to a threshold voltage control signal associated with the termination control signal.

The reference voltage may be a constant voltage.

The termination operating mode may be one of a non-termination mode in which termination is not performed, a pseudo open drain (POD) termination mode, and a VSSQ termination mode.

The termination circuit may be selectively enabled in response to the termination control signal, and have a resistance value that is variable.

The receiver may include at least one amplification unit configured to operate in response to the reference voltage and the input signal; a threshold voltage increasing unit connected between a first power supply voltage source and an output terminal of the at least one amplification unit, and configured to increase the logic threshold voltage of the receiver according to the threshold voltage control signal; and a threshold voltage decreasing unit connected between a second power supply voltage source and the output terminal of the at least one amplification unit, and configured to decrease the logic threshold voltage of the receiver according to the threshold voltage control signal.

According to another aspect of the inventive concept, a signaling method includes changing a termination operating mode by controlling a termination circuit connected to a signal line; changing a logic threshold voltage of a receiver based on the changed termination operating mode; and generating an output signal by comparing an input signal input to the receiver via the signal line with a reference voltage. The reference voltage is a constant voltage.

The termination circuit may be selectively enabled according to a termination control signal, and have a resistance value that is variable.

The logic threshold voltage of the receiver may be controlled to have a first threshold value in a non-termination mode in which the termination circuit is disabled, and to have a second threshold value in a termination mode in which the termination circuit is enabled. The second threshold value may be greater than the first threshold value.

The logic threshold voltage of the receiver may be controlled to have a first threshold value in a first termination mode in which a resistance value of the termination circuit is a first value, and to have a second threshold value in a second termination mode in which a resistance value of the termination circuit is a second value which is greater than the first value. The second threshold value may be greater than the first threshold value.

In accordance with principles of inventive concepts, a semiconductor device includes a receiver configured to receive a reference voltage via a first input terminal, receive an input signal via a second input terminal, and to generate an output signal by comparing the reference voltage to the input signal; and a termination circuit connected to the second input terminal and configured to change a termination operating mode in response to a termination control signal, wherein a logic threshold voltage of the receiver is changed according to the termination operating mode in response to a threshold voltage control signal associated with the termination control signal.

In accordance with principles of inventive concepts, the reference voltage is a constant voltage that is fixed regardless of the termination operating mode.

In accordance with principles of inventive concepts, the termination operating mode is one of: a non-termination mode in which termination there is no termination, a pseudo open drain (POD) termination mode, and a VSSQ termination mode.

In accordance with principles of inventive concepts, the termination circuit is selectively enabled in response to the termination control signal, and has a resistance value that is variable.

In accordance with principles of inventive concepts, the receiver includes at least one amplification unit configured to operate in response to the reference voltage and the input signal; a threshold voltage increasing unit connected between a first power supply voltage source and an output terminal of the at least one amplification unit, and configured to increase the logic threshold voltage of the receiver according to the threshold voltage control signal; and a threshold voltage decreasing unit connected between a second power supply voltage source and the output terminal of the at least one amplification unit, and configured to decrease the logic threshold voltage of the receiver according to the threshold voltage control signal.

In accordance with principles of inventive concepts, the logic threshold voltage of the receiver is controlled to have a first threshold value in a non-termination mode in which the termination circuit is disabled, and is controlled to have a second threshold value in a termination mode in which the termination circuit is enabled, wherein the second threshold value is greater than the first threshold value.

In accordance with principles of inventive concepts the logic threshold voltage of the receiver is controlled to have a first threshold value in a first termination mode in which a resistance value of the termination circuit is a first value, and is controlled to have a second threshold value in a second termination mode in which a resistance value of the termination circuit is a second value which is greater than the first value, wherein the second threshold value is greater than the first threshold value.

In accordance with principles of inventive concepts, a semiconductor device includes a first reference voltage generation circuit configured to generate a first reference voltage and output the first reference voltage as the reference voltage.

In accordance with principles of inventive concepts, a semiconductor device includes a first reference voltage generation circuit configured to generate a first reference voltage; and a selector configured to select one of the first reference voltage and a second reference voltage which is generated outside the semiconductor device and applied to the semiconductor device, and output the selected reference voltage as the reference voltage.

In accordance with principles of inventive concepts, a signaling method includes changing a termination operating mode by controlling a termination circuit connected to a signal line; changing a logic threshold voltage of a receiver based on the changed termination operating mode; and generating an output signal by comparing an input signal input to the receiver via the signal line with a reference voltage, wherein the reference voltage is a constant voltage.

In accordance with principles of inventive concepts, the termination circuit is selectively enabled according to a termination control signal, and has a resistance value that is variable.

In accordance with principles of inventive concepts, the logic threshold voltage of the receiver is controlled to have a first threshold value in a non-termination mode in which the termination circuit is disabled, and to have a second threshold value in a termination mode in which the termination circuit is enabled, wherein the second threshold value is greater than the first threshold value.

In accordance with principles of inventive concepts, the logic threshold voltage of the receiver is controlled to have a first threshold value in a first termination mode in which a resistance value of the termination circuit is a first value, and to have a second threshold value in a second termination mode in which a resistance value of the termination circuit is a second value which is greater than the first value, wherein the second threshold value is greater than the first threshold value.

In accordance with principles of inventive concepts, a method includes generating a first reference voltage in a semiconductor device; receiving a second reference voltage input outside the semiconductor device; and selecting one of the first reference voltage and the second reference voltage and outputting the selected reference voltage as the reference voltage.

In accordance with principles of inventive concepts, a signaling method includes adjusting the value of a received signal according to the value of termination on a line associated with the received signal; and comparing the adjusted received signal to a fixed reference voltage to produce a received signal.

In accordance with principles of inventive concepts, the signal is received at a memory controller and the memory controller controls the termination value of the line associated with the signal and the adjustment of the received signal.

In accordance with principles of inventive concepts, a memory controller controls the line termination to be open, pseudo-open-drain, or VSSQ termination.

In accordance with principles of inventive concepts, the signal is received from a double data rate memory device.

In accordance with principles of inventive concepts, the received signal level is pulled down according to a termination mode.

In accordance with principles of inventive concepts, the received signal level is pulled up according to a termination mode.

BRIEF DESCRIPTION OF THE DRAWINGS

Exemplary embodiments of the inventive concept will be more clearly understood from the following detailed description taken in conjunction with the accompanying drawings in which.

DESCRIPTION

Figure 1:
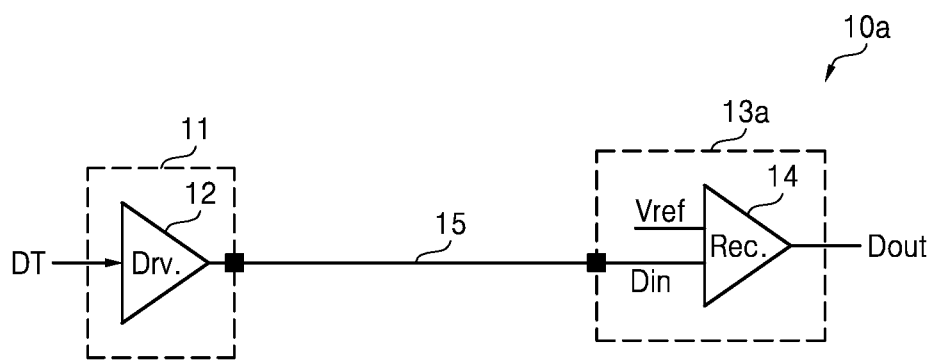
FIG. 1 illustrates a semiconductor device that does not use pseudo open drain (POD) termination.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings.

FIG. 1 illustrates a semiconductor device 10a that does not use pseudo open drain (POD) termination (which may be a mode of operation in accordance with principles of inventive concepts). Signal transmitter 11 transmits a signal to the signal receiver 13a via a signal line 15. The signal receiver 13a receives the signal transmitted via the signal line 15. Signal receiver 13a includes a comparator 14 that compares an input signal Din with a reference voltage Vref and generates an output signal Dout. The reference voltage Vref is applied to a first input terminal of the comparator 14, and the input signal Din is supplied to a second input terminal of the comparator 14. The second input terminal of the comparator 14 is not terminated in this exemplary embodiment of a non-terminated mode of operation.

Figure 2:
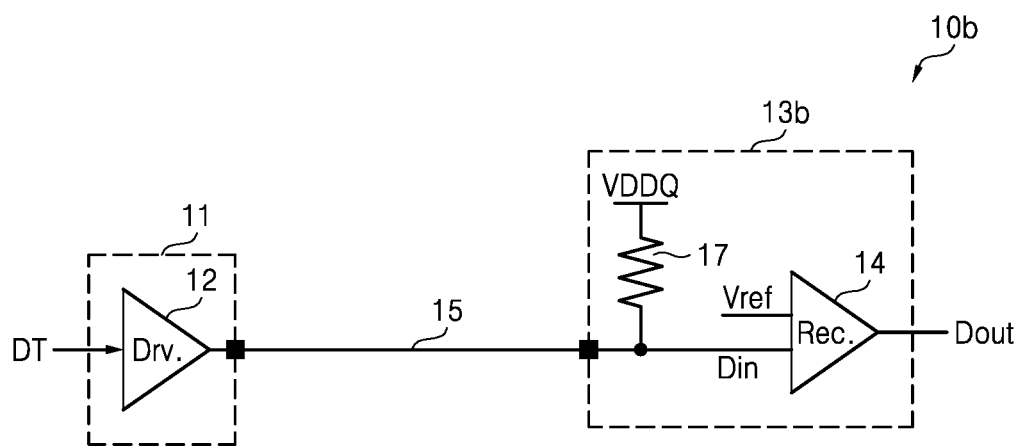
FIG. 2 illustrates a semiconductor device that uses POD termination.

FIG. 2 illustrates an exemplary embodiment of a semiconductor device 10b that uses POD termination in accordance with principles of inventive concepts. Referring to FIG. 2, a signal transmitter 11 is the same as the signal transmitter 11 of FIG. 1. In the signal receiver 13b, a comparator 14 compares an input signal Din with a reference voltage Vref and generates an output signal Dout, similar to the comparator 14 of the signal receiver 13a illustrated in FIG. 1. However, in this exemplary embodiment in accordance with principles of inventive concepts, the comparator 14 of the signal receiver 13b illustrated in FIG. 2 is different from the comparator 14 of the signal receiver 13a illustrated in FIG. 1, in that a second input terminal is terminated with a first power supply voltage VDDQ source through a termination resistor 17. That is, the second input terminal of the comparator 14 of the signal receiver 13b is connected to the first power supply voltage VDDQ source via the termination resistor 17.

Figure 3:
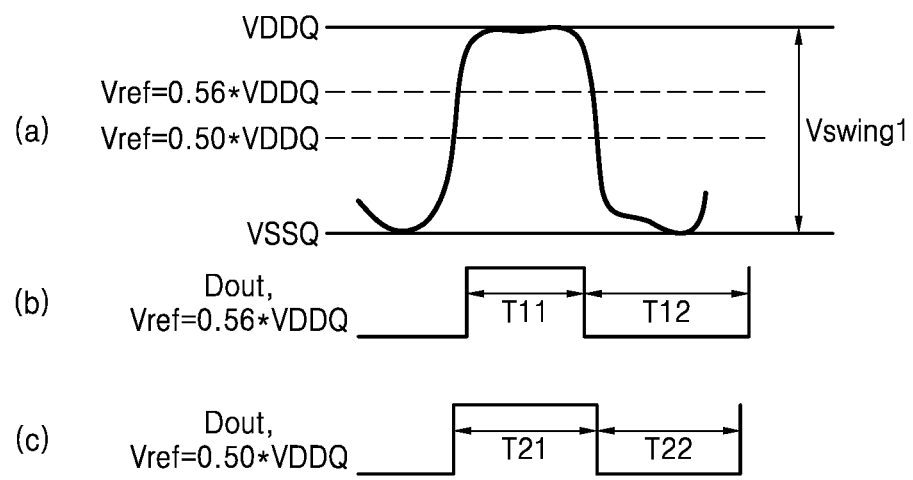
FIG. 3 is a schematic waveform diagram of a signal input to and a signal output from the signal receiver of FIG. 1.

FIG. 3 is a schematic waveform diagram of a signal Din input to and a signal Dout output from the signal receiver 13a of FIG. 1. Referring to FIG. 3(a), the input signal Din swings between a first power supply voltage VDDQ and a second power supply voltage VSSQ. Thus, the swing width Vswing1 of the input signal Din is equal to the difference between the first power supply voltage VDDQ and the second power supply voltage VSSQ, i.e., (VDDQ−VSSQ).

With such a voltage swing, the reference voltage Vref may be set at (VDDQ−VSSQ)/2. If, for example, the second power supply voltage VSSQ is 0 V, i.e., a ground voltage, the reference voltage Vref may be VDDQ/2. The output signal Dout when the reference voltage Vref is 0.56×VDDQ is illustrated in FIG. 3(b). The output signal Dout when the reference voltage Vref is 0.5×VDDQ is illustrated in FIG. 3(c). Referring to FIG. 3(c), a duty ratio of the output signal Dout when the reference voltage Vref is 0.5×VDDQ is substantially the same as 50%. That is, a logic high section T21 of the output signal Dout is similar to a logic low section T22 thereof. However, when the reference voltage Vref is 0.56×VDDQ, a logic high section T11 of the output signal Dout is shorter than a logic low section T12 thereof.

Figure 4:
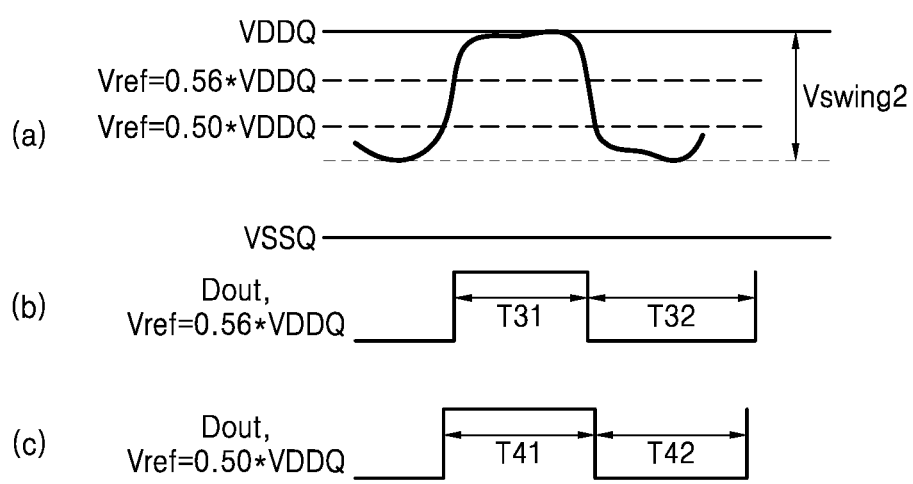
FIG. 4 is a schematic waveform diagram of a signal input to and a signal output from the signal receiver of FIG. 2.

FIG. 4 is a schematic waveform diagram of a signal Din input to and a signal Dout output from the signal receiver 13b of FIG. 2. Referring to FIG. 4(a), the input signal Din swings between a first power supply voltage VDDQ and a second swing voltage. The second swing voltage is higher than a second power supply voltage VSSQ. Thus, a swing width Vswing2 of the input signal Din is less than the swing width Vswing1 of the input signal Din of FIG. 3(a).

The output signal Dout when a reference voltage Vref is 0.56×VDDQ is illustrated in FIG. 4(b), and the output signal Dout when the reference voltage Vref is 0.5×VDDQ is illustrated in FIG. 4(c). Referring to FIGS. 4(b) and (c), a duty ratio of the output signal Dout when the reference voltage Vref is 0.56×VDDQ is different from the duty ratio of the output signal Dout when the reference voltage Vref is 0.5×VDDQ.

As illustrated by these examples, the duty ratio of an output signal of a signal receiver may vary according to whether termination is performed and according to the reference voltage. Because memory devices may employ double data rate (DDR) operation, the duty ratio characteristics of a signal output from a signal receiver included in the memory device may be very important. As illustrated in FIGS. 3 and 4, the duty ratio of the output signal of the signal receiver may vary according to a reference voltage. The reference voltage may be dynamically changed according to a termination operating mode; one reference voltage may be employed in a mode in which a termination circuit is enabled (for example, a POD mode), and another reference voltage may be employed in a mode in which the termination circuit is disabled (for example, non-POD mode), for example.

To increase the efficiency of a mobile device such as a smart phone, the time required to convert a termination operating mode should be minimized, but delays may be introduced by changing reference voltages.

Figure 5:
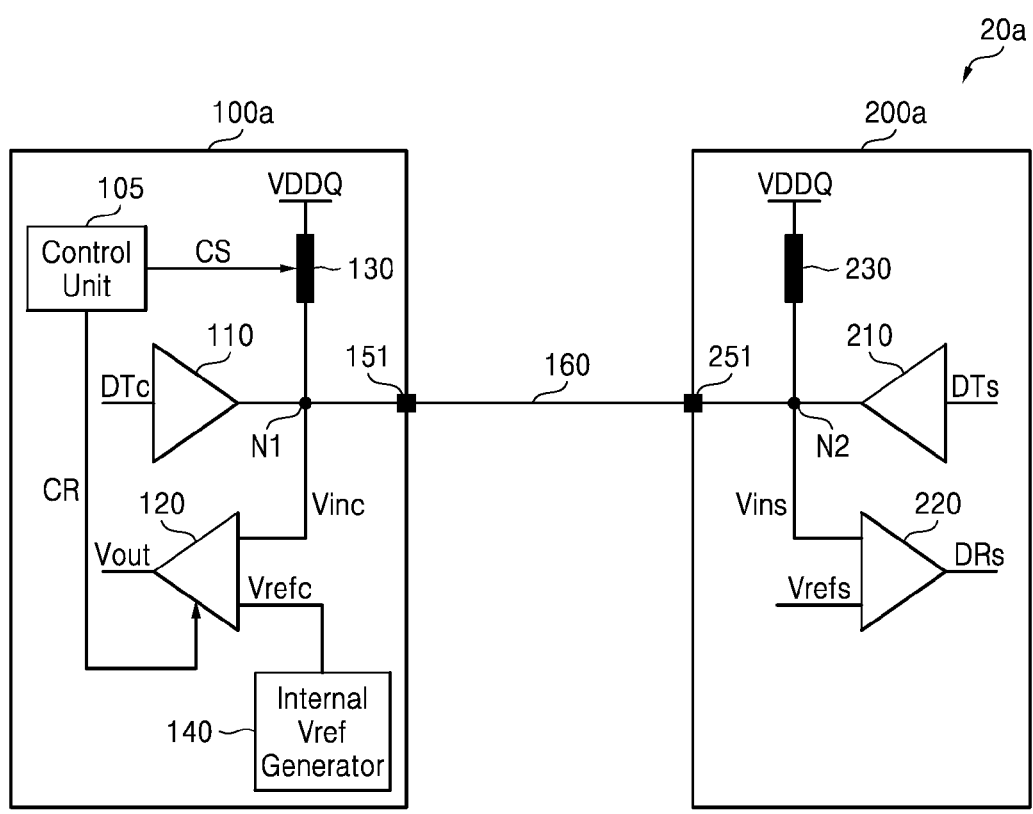
FIG. 5 is a schematic block diagram of a signaling system according to an exemplary embodiment in accordance with principles of inventive concepts.

FIG. 5 is a schematic block diagram of an exemplary embodiment of a signaling system 20a in accordance with principles of inventive concepts. Signaling system 20a includes a first semiconductor device 100a and a second semiconductor device 200a.

The first semiconductor device 100a includes a first transmitter 110, a first receiver 120, a first termination circuit 130, and a first reference voltage generation circuit 140. The first semiconductor device 100a may be a memory controller, for example.

The second semiconductor device 200a includes a second transmitter 210, a second receiver 220, and a second termination circuit 230. The second semiconductor device 200a may be a memory device, such as a DDR dynamic random access memory (DRAM), for example.

The first transmitter 110 transmits a first signal Vins to the second receiver 220 via a first signal line 160. The first signal Vins may be a control signal, a data signal, or an address signal.

An output terminal of the first transmitter 110 is connected to a first power supply voltage VDDQ source via the first termination circuit 130. The first termination circuit 130 may be selectively enabled according to a termination control signal CS. In exemplary embodiments in accordance with principles of inventive concepts, a resistance value of the first termination circuit 130 is variable according to the termination control signal CS. The first semiconductor device 100a may include a control unit 105 to generate the termination control signal CS.

In exemplary embodiments in accordance with principles of inventive concepts, control unit 105 may change a termination operating mode by changing the termination control signal CS according to an operating frequency or an operating mode (for example, a lower-power mode, a sleep mode, etc.) of the first semiconductor device 100a, for example.

The first receiver 120 receives a second signal Vinc from the second transmitter 210 via the first signal line 160. The second signal Vinc may be a control signal, a data signal, or an address signal, for example. The first signal line 160 is a bidirectional signal line in an exemplary embodiment, but may be a unidirectional signal line, for example.

The first receiver 120 compares the second signal Vinc with a reference voltage Vrefc and generates a first output signal Vout. The reference voltage Vrefc and the second signal Vinc are applied to a first input terminal and a second input terminal of the first receiver 120, respectively. A logic threshold voltage of the first receiver 120 is variable according to a threshold voltage control signal CR. That is, the level of the received voltage Vinc may be adjusted in accordance with principles of inventive concepts. In accordance with principles of inventive concepts, threshold voltage control signal CR is associated with the termination control signal CS, and may be the same as the termination control signal CS or may be generated based on the termination control signal CS, for example. The threshold voltage control signal CR may be output from the control unit 105 that outputs the termination control signal CS.

The second transmitter 210 transmits the second signal Vinc to the first receiver 120 via the first signal line 160. An output terminal of the second transmitter 210 is connected to the first power supply voltage VDDQ source via the second termination circuit 230. Although not shown, in accordance with principles of inventive concepts, the second termination circuit 230 may be selectively enabled according to the termination control signal CS, as with the first termination circuit 130. A resistance value of the second termination circuit 230 may be variable according to the termination control signal CS. The second semiconductor device 200a may further include a control unit (not shown) to generate the termination control signal CS.

The second receiver 220 receives the first signal Vins from the first transmitter 110 via the first signal line 160. The second receiver 220 compares the first signal Vins with the reference voltage Vrefs and outputs a second output signal DRs.

Figure 6:
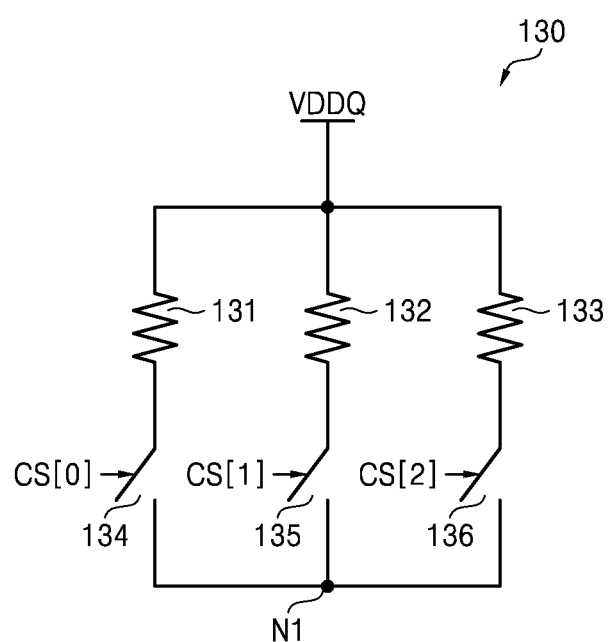
FIG. 6 is a circuit diagram of a first termination circuit illustrated in FIG. 5 according to an exemplary embodiment in accordance with principles of inventive concepts.

FIG. 6 is a circuit diagram of an exemplary embodiment of the first termination circuit 130 in accordance with principles of inventive concepts, illustrated in FIG. 5. First termination circuit 130 may include at least one resistor and at least one switch. In the exemplary embodiment of FIG. 6, the first termination circuit 130 includes first to third resistors 131 to 133, and first to third switches 134 to 136 connected in series to the first to third resistors 131 to 133, respectively. However, this is merely an exemplary embodiment and the number of resistors and the number of switches that are to be included in the first termination circuit 130 may be changed, and connections between resistors and switches may be also changed.

In the embodiment of FIG. 6, a termination control signal CS may be embodied as a 3-bit digital signal CS[0], CS [1], and CS[2].

In exemplary embodiments, when all bits of the 3-bit termination control signal CS[0], CS[1], and CS[2] are '0', all the first to third switches 134 to 136 are opened to disable the first termination circuit 130. In this configuration, the first semiconductor device 100a of FIG. 5 may operate in a non-termination mode.

When at least one of the bits of the 3-bit termination control signals CS[0], CS[1], and CS[2] is '1', a switch corresponding to '1' among the first to third switches 134 to 136 is closed to enable the first termination circuit 130. In this configuration, the first semiconductor device 100a may be operated in a POD termination mode. Additionally, a resistance value of the first termination circuit 130 may vary, depending on which bit of the bits of the 3-bit termination control signal CS[0], CS[1], and CS[2] is '1'.

In the above-described manner, a termination operating mode and/or a termination resistance value may change according to the termination control signal CS. The second termination circuit 230 may be embodied in the same manner as the first termination circuit 130.

In the exemplary embodiment of FIG. 6, when the first termination circuit 130 is enabled, the first termination circuit 130 may be operated in the POD termination mode. However, in another embodiment, when the first termination circuit 130 is enabled, the first termination circuit 130 may be operated in the POD termination mode or a VSSQ termination mode according to the termination control signal CS. That is, in exemplary embodiments in accordance with principles of inventive concepts, the first termination circuit 130 may include elements (for example, a resistor and switch connected in series between the node N1 and a second power supply voltage VSSQ) to selectively connect a node N1 to a second power supply voltage VSSQ source.

Figure 7:
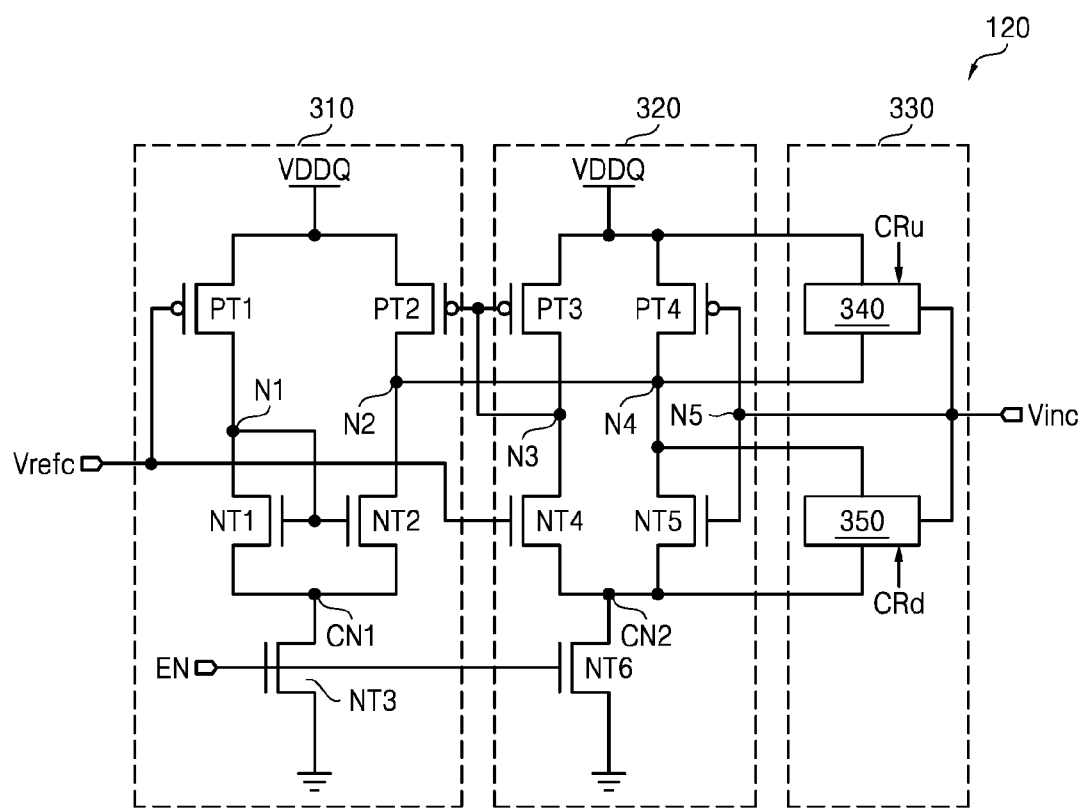
FIG. 7 is a circuit diagram of a first receiver illustrated in FIG. 5 according to an exemplary embodiment in accordance with principles of inventive concepts.
Figure 8:
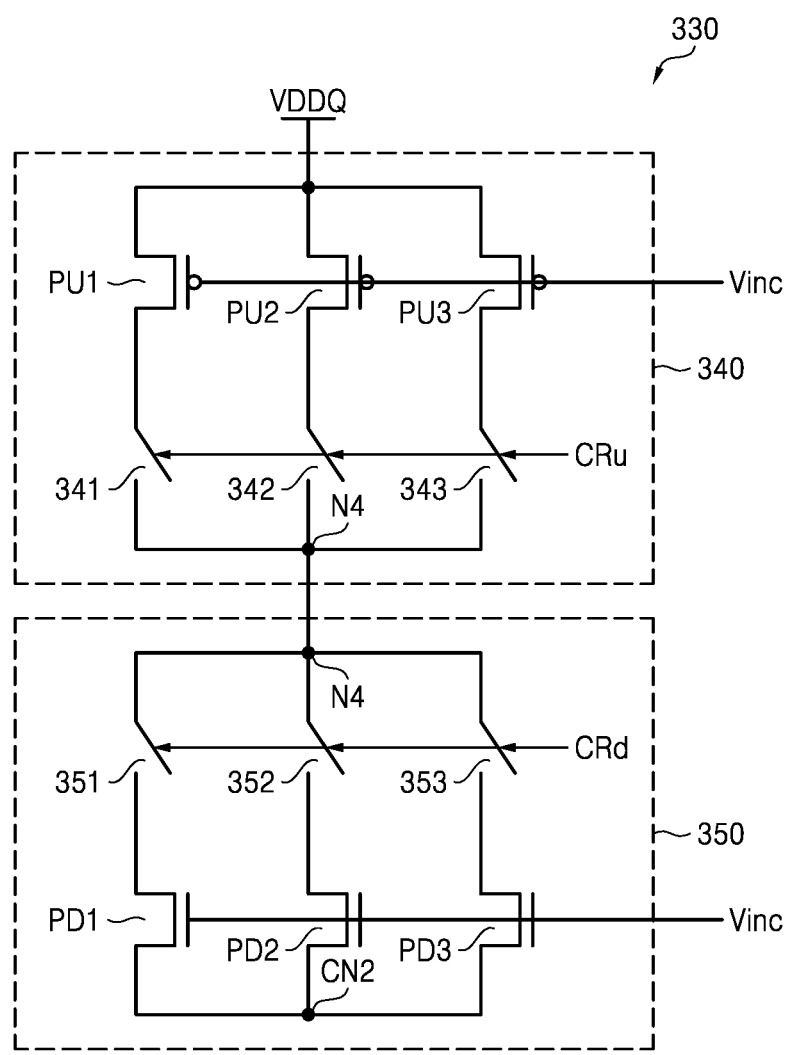
FIG. 8 is a circuit diagram of a threshold voltage controller illustrated in FIG. 7 to an exemplary embodiment in accordance with principles of inventive concepts.

FIG. 7 is a circuit diagram of an exemplary embodiment of the first receiver 120 in accordance with principles of inventive concepts illustrated in FIG. 5. FIG. 8 is a circuit diagram of an exemplary embodiment of the threshold voltage controller 330 in accordance with principles of inventive concepts illustrated in FIG. 7.

Referring to FIG. 7, the first receiver 120 includes a first differential amplification unit 310, a second differential amplification unit 320, and a threshold voltage controller 330.

The first differential amplification unit 310 may include first to third NMOS transistors NT1, NT2, and NT3 and first and second PMOS transistors PT1 and PT2.

The second differential amplification unit 320 may include fourth to sixth NMOS transistors NT4, NT5, and NT6 and third and fourth PMOS transistors PT3 and PT4.

A reference voltage Vrefc is applied to gates of the first PMOS transistor PT1 and the fourth NMOS transistor NT4. Gates of the first and second NMOS transistors NT1 and NT2 are commonly connected to a drain N1 of the first PMOS transistor PT1, and sources of the first and second NMOS transistors NT1 and NT2 are commonly connected to a first common node CN1. The first PMOS transistor PT1 is connected between a first power supply voltage VDDQ source and a drain of the first NMOS transistor NT1. The second PMOS transistor PT2 is connected between the first power supply voltage VDDQ source and an output node N2, and a gate of the second PMOS transistor PT2 is connected to a gate and a drain N3 of the third PMOS transistor PT3.

The third NMOS transistor NT3 is connected between the first common node CN1 and a ground voltage source, and is enabled according to a receiver enable signal EN.

A drain of the fourth NMOS transistor NT4 is connected to the gate and the drain N3 of the third PMOS transistor PT3, and a source of the fourth NMOS transistor NT4 is connected to a second common node CN2.

The fifth NMOS transistor NT5 is connected between the output node N2 and the second common node CN2, and a gate of the fifth NMOS transistor NT5 is connected to a signal input node N5.

The sixth NMOS transistor NT6 is connected between the second common node CN2 and the ground voltage source, and is enabled according to the receiver enable signal EN.

The third PMOS transistor PT3 is connected between the first power supply voltage VDDQ source and the drain N3 of the fourth NMOS transistor NT4. The fourth PMOS transistor PT4 is connected between the first power supply voltage VDDQ source and the output node N2, and a gate thereof is connected to the signal input node N5.

The threshold voltage controller 330 may include a threshold voltage increasing unit 340 and a threshold voltage decreasing unit 350. The threshold voltage increasing unit 340 may operate according to an input signal Vinc and a threshold voltage increase control signal CRu, and adjust a logic threshold voltage of the receiver 120 to be higher than 0.5×VDDQ. The threshold voltage decreasing unit 350 may operate according to the input signal Vinc and a threshold voltage decrease control signal CRd, and adjust the logic threshold voltage of the receiver 120 to be lower than 0.5×VDDQ.

Referring to FIG. 8, the threshold voltage increasing unit 340 includes a plurality of pull-up transistors PU1 to PU3 and a plurality of pull-up switches 341 to 343.

Each of the pull-up transistors PU1 to PU3 is connected between a first power supply voltage VDDQ source and an output node N4, and operates according to an input signal Vinc. The pull-up transistors PU1 to PU3 may be connected to the pull-up switches 341 to 343, respectively, and may be turned on when the pull-up switches 341 to 343 are turned on. For example, in exemplary embodiments, the pull-up switches 341 to 343 may be installed to correspond to the pull-up transistors PU1 to PU3, respectively, and connected between the pull-up transistors PU1 to PU3 and the first power supply voltage VDDQ source or between the pull-up transistors PU1 to PU3 and the output node N4. However, embodiments of inventive concepts are not limited thereto and the pull-up switches 341 to 343 need not be installed to correspond to the pull-up transistors PU1 to PU3, respectively.

In exemplary embodiments in accordance with principles of inventive concepts, pull-up switches 341 to 343 are selectively turned on according to a threshold voltage control increase signal Cru, as are the pull-up transistors PU1 to PU3. The more transistors that are turned on and associated switches closed according to the threshold voltage increase control signal Cru among the pull-up transistors PU1 to PU3, the higher the logic threshold voltage of the first receiver 120 than 0.5×VDDQ.

In exemplary embodiments in accordance with principles of inventive concepts, threshold voltage decreasing unit 350 includes a plurality of pull-down transistors PD1 to PD3 and a plurality of pull-down switches 351 to 353.

Each of the pull-down transistors PD1 to PD3 is connected between a ground voltage source and the output node N4, and operates according to the input signal Vinc. The pull-down transistors PD1 to PD3 may be connected to the pull-down switches 351 to 353, respectively, and operate when the pull-down switches 351 to 353 are turned on. In exemplary embodiments in accordance with principles of inventive concepts, the pull-down switches 351 to 353 may be installed to correspond to the pull-down transistors PD1 to PD3, respectively, and connected between the pull-down transistors PD1 to PD3 and the ground voltage source or between the pull-down transistors PD1 to PD3 and the output node N4. However, embodiments of inventive concepts are not limited thereto, and the pull-down switches 351 to 353 need not be installed to correspond to the pull-down transistors PD1 to PD3, respectively.

In exemplary embodiments in accordance with principles of inventive concepts, pull-down switches P351 to 353 are selectively turned on according to the threshold voltage decrease control signal CRd, as are pull-down transistors PD1 to PD3. The more transistors that are turned on and associated switches closed according to the threshold voltage decrease control signal CRd among the pull-down transistors PD1 to PD3, the lower the logic threshold voltage of the first receiver 120 than 0.5×VDDQ.

Figure 9:
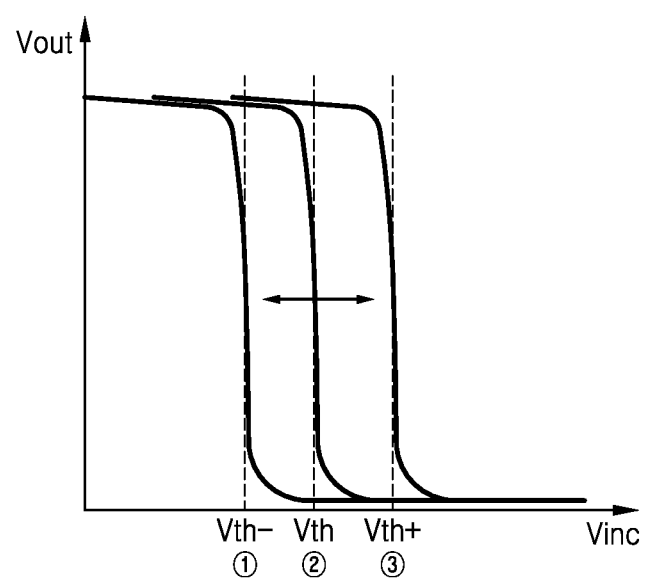
FIG. 9 is a graph showing a relationship between an input signal and an output signal according to a logic threshold voltage of a first receiver.

FIG. 9 is a graph showing the relationship between an input signal Vinc and an output signal Vout and how it varies according to changes in logic the threshold voltage of the first receiver 120 of FIG. 5. Referring to FIG. 9, the voltage of the output signal Vout is maintained at a first logic level (for example, '1') when a voltage of the input signal Vinc is lower than a threshold voltage, and changes to a second logic level (for example, '0') when the voltage of the input signal Vinc is higher than the threshold voltage.

For example, if the threshold voltage of the receiver 120 is equal to a first threshold voltage Vth−, the voltage of the output signal Vout is maintained at the first logic level (for example, '1') when the voltage of the input signal Vinc is lower than the first threshold voltage Vth−, and changes to the second logic level (for example, '0') when the voltage of the input signal Vinc is higher than the first threshold voltage Vth−. Similarly, when the threshold voltage of the receiver 120 decreases from a second threshold voltage Vth to the first threshold voltage Vth−, the voltage of the input signal Vinc that changes a logic level of the output signal Vout also decreases.

If the threshold voltage of the receiver 120 is equal to a third threshold voltage Vth+, the output signal Vout is maintained at the first logic level (for example, '1') when the voltage of the input signal Vinc is lower than the third threshold voltage Vth+ and changes to the second logic level (for example, '0') when the voltage of the input signal Vinc is higher than the third threshold voltage Vth+. That is, when the threshold voltage of the receiver 120 increases from the second threshold voltage Vth to the third threshold voltage Vth+, the voltage of the input signal Vinc that changes the logic level of the output signal Vout also increases.

Changing the threshold voltage of the receiver 120 may produce an effect similar to that of changing a reference voltage Vrefc. In accordance with principles of inventive concepts, rather than change a reference voltage Vrefc in order to accommodate different termination modes, a threshold voltage may be changed. In this manner, different termination modes may be accommodated without incurring penalties, such as slower operation or skewed duty cycles, which may be incurred by altering a reference voltage Vrefc.

Figure 10:
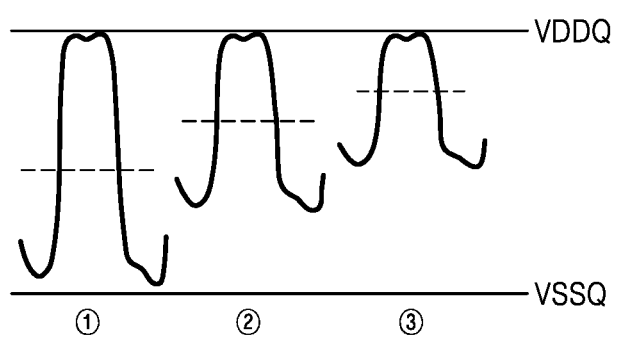
FIG. 10 is a schematic graph showing a variation in a logic threshold voltage according to a termination operating mode according to an exemplary embodiment in accordance with principles of inventive concepts.

The graphical representation of FIG. 10 illustrates a variation in logic threshold voltage according to termination operating mode in exemplary embodiments in accordance with principles of inventive concepts. Referring to FIGS. 5 to 10, graphical representation (1) of FIG. 10 may denote a waveform of the input signal Vinc in a non-termination mode in which, for example, the first termination control circuit 130 is "off" or in a neutral state, which may be a state associated with no termination resistance applied. In the non-termination mode, a threshold voltage of the first receiver 12 may be controlled to be equal to the first threshold voltage Vth− as illustrated in FIG. 9. In FIG. 10, graphical representation (2) of FIG. 10 may denote a waveform of the input signal Vinc in a first POD termination mode in which the first termination control circuit 130 is enabled and a termination resistance value is a first value. In the first POD termination mode, the threshold voltage of the first receiver 12 may be controlled to be equal to the second threshold voltage Vth as illustrated in FIG. 9, for example.

In FIG. 10, graphical representation (3) may denote a waveform of the input signal Vinc in a second POD termination mode in which the first termination control circuit 130 is enabled and the termination resistance value is a second value that is greater than the first value, for example. In the second POD termination mode, the threshold voltage of the first receiver 12 may be controlled to be equal to the third threshold voltage Vth+ as illustrated in FIG. 9.

In accordance with principles of inventive concepts an effect similar to that when the reference voltage Vrefc is changed may be obtained by changing the threshold voltage of the receiver 120 in order to accommodate various termination operation modes. By avoiding changes in the voltage reference Vrefc a system and method in accordance with principles of inventive concepts may avoid delays or other pitfalls associated with changing the value of the voltage reference to accommodate various termination modes.

Figure 11:
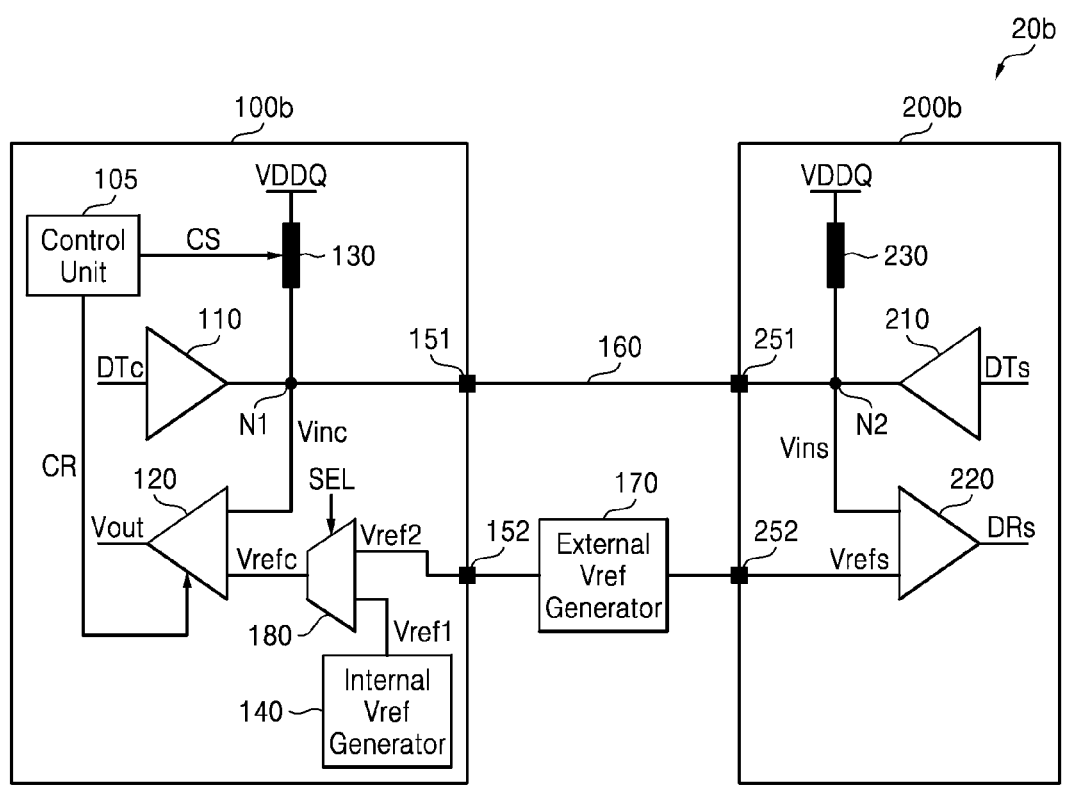
FIG. 11 is a schematic block diagram of a signaling system according to an exemplary embodiment in accordance with principles of inventive concepts.
Figure 12:
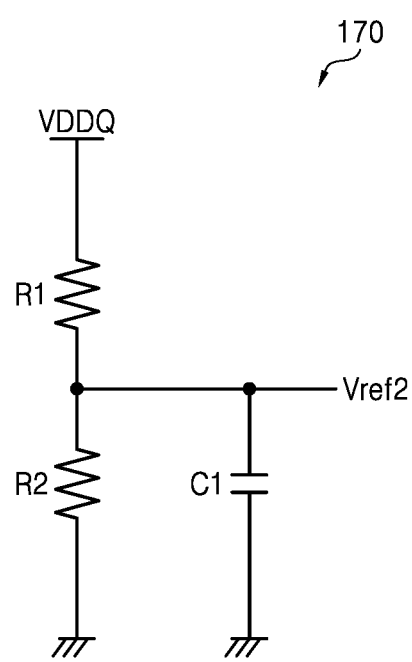
FIG. 12 is a circuit diagram of a second reference voltage generation circuit illustrated in FIG. 11 according to an exemplary embodiment in accordance with principles of inventive concepts.

FIG. 11 is a schematic block diagram of a signaling system 20b according to another exemplary embodiment in accordance with principles of inventive concepts. FIG. 12 is a circuit diagram of an exemplary embodiment of a second reference voltage generation circuit 170 illustrated in FIG. 11 in accordance with principles of inventive concepts. The signal transmitting/receiving system 20b of FIG. 11 has a structure similar to that of the signaling system 20a of FIG. 5. As a result, the signaling system 20b of FIG. 11 will be described focusing on the differences between the signal transmitting/receiving systems 20a and 20b to avoid a redundant description.

The signaling system 20b of FIG. 11 further includes (compared to the signaling system 20a of FIG. 5) a second reference voltage generation circuit 170 outside first semiconductor device 100b and second semiconductor device 200b.

The second reference voltage generation circuit 170 may be outside the first and second semiconductor devices 100b and 200b, for example, on a board on which the first and second semiconductor devices 100b and 200b are mounted. The second reference voltage generation circuit 170 may include at least one resistor, for example, resistors R1 and R2, and a capacitor C1 as illustrated in FIG. 12. The second reference voltage generation circuit 170 may generate a second reference voltage Vref2 and apply it to the first semiconductor device 100b.

The first semiconductor device 100b may include a pad 152 configured to receive the second reference voltage Vref2, and a selector 180 configured to select and output one of a first reference voltage Vref1 and the second reference voltage Vref2 according to a selection signal SEL.

In exemplary embodiments the selection signal SEL may be predetermined by a designer, tester, technician, or a user, for example. That is, one of the first reference voltage Vref1 and the second reference voltage Vref2 may be selected under control of an individual such as a system designer, system user, original equipment manufacturer, or a test technician, for example. In other exemplary embodiments, the selection signal SEL may be changed during operation of the signaling system 20b.

In accordance with principles of inventive concepts, a signal threshold level may be altered to accommodate a signal termination mode. By adjusting a signal threshold level of a receiver a system and method in accordance with principles of inventive concepts may reduce the effects on the duty ratio of a signal that otherwise might be imposed by changes in a termination mode. Such accommodation of termination mode changes may be achieved without altering a reference voltage value, which may impose its own penalties in speed of operation, for example. A memory controller operating with a DDR memory may be particularly well suited for inclusion of circuitry in accordance with principles of inventive concepts.

According to an embodiment of the inventive concept, a reference voltage that is fixed regardless of a termination operating mode is used and a time to be needed to change the reference voltage according to the termination operating mode may be thus saved. Also, according to an embodiment of the inventive concept, a logic threshold voltage of a receiver is adjusted according to a termination operating mode, and a change in a duty ratio of an output signal of the receiver may be reduced even when a swing level of an input signal of the receiver changes.

While inventive concepts have been particularly shown and described with reference to exemplary embodiments thereof, it will be understood that various changes in form and details may be made therein without departing from the spirit and scope of inventive concepts as set forth in the following claims.

What is claimed is:

1. A semiconductor device comprising:
   a receiver configured to receive a reference voltage having a fixed value regardless of a termination operating mode, to receive an input signal from an external device via an input node, and to generate an output signal by comparing the reference voltage with the input signal; and
   a termination circuit connected to the input node and configured to change the termination operating mode in response to a termination control signal, wherein
   the termination control signal is associated with a swing level of the input signal.

2. The semiconductor device of claim 1, wherein a logic threshold voltage of the receiver is changed according to the termination operating mode in response to a threshold voltage control signal associated with the termination control signal.

3. The semiconductor device of claim 1, wherein the termination operating mode includes at least one of: a non-termination mode in which there is no termination, a pseudo open drain (POD) termination mode, and a VSSQ termination mode.

4. The semiconductor device of claim 1, wherein the swing level of the input signal swings between a first power supply voltage and a second power supply voltage.

5. The semiconductor device of claim 1, wherein the termination circuit is selectively enabled in response to the termination control signal.

6. The semiconductor device of claim 1, wherein a logic threshold voltage of the receiver is varied based on a threshold voltage control signal.

7. The semiconductor device of claim 1, further comprising a first reference voltage generation circuit configured to generate a first reference voltage and output the first reference voltage as the reference voltage.

8. The semiconductor device of claim 1, further comprising:
   a first reference voltage generation circuit configured to generate a first reference voltage; and
   a selector configured to select, as a selected reference voltage, one of the first reference voltage and a second reference voltage which is generated outside the semiconductor device and applied to the semiconductor device, and output the selected reference voltage as the reference voltage.

9. The semiconductor device of claim 1, wherein the external device is a double data rate (DDR) dynamic random access memory (DRAM).

10. The semiconductor device of claim 1, wherein the external device is a memory controller.

11. A semiconductor device comprising:
    a receiver configured to receive a reference voltage having a fixed value regardless of a termination operating mode, to receive an input signal from an external device via an input node according to a control signal, and to generate an output signal by comparing the reference voltage with the input signal; and
    a termination circuit connected to the input node and configured to change the termination operating mode in response to a termination control signal, wherein:
    the termination control signal is associated with a swing level of the input signal, and
    the control signal is associated with an operating frequency or an operating mode of the semiconductor device.

12. The semiconductor device of claim 11, wherein the external device is a double data rate dynamic random access memory (DRAM).

13. The semiconductor device of claim 11, wherein the operating mode is a low-power mode of the semiconductor device.

14. The semiconductor device of claim 11, wherein the input node is coupled to a power supply voltage source.

15. The semiconductor device of claim 11, further comprising a control circuit configured to generate the termination control signal.

16. The semiconductor device of claim 11, further comprising a transmitter configured to transmit another output signal to the external device.

17. A signaling system comprising:
    a first semiconductor device including:
    a first receiver configured to receive a first reference voltage having a fixed value regardless of a termination operating mode, to receive an input signal from a second semiconductor device via a signal line, and to generate a first output signal by comparing the first reference voltage with the input signal;
    a first termination circuit connected to the signal line and configured to change the termination operating mode in response to a termination control signal; and
    a first transmitter configured to transmit a second output signal to the second semiconductor device via the signal line, wherein:
    the second semiconductor device includes:

a second receiver configured to receive a second reference voltage, to receive the second output signal from the first semiconductor device via the signal line, and to generate a third output signal by comparing the second reference voltage with the second output signal; and a second transmitter configured to transmit the input signal to the first semiconductor device, and the termination control signal is associated with a swing level of the input signal.

18. The signaling system of claim 17, wherein the second semiconductor device is a double data rate (DDR) dynamic random access memory (DRAM).

19. The signaling system of claim 17, wherein the first semiconductor device includes a first reference voltage generation circuit configured to generate the first reference voltage.

20. The signaling system of claim 17, wherein the first reference voltage is generated outside of the first semiconductor device.

* * * * *